US006944386B2

(12) United States Patent
Hamilton

(10) Patent No.: US 6,944,386 B2
(45) Date of Patent: Sep. 13, 2005

(54) OPTICAL DEVICES

(75) Inventor: Craig James Hamilton, Ralston (GB)

(73) Assignee: The University Court of the University of Glasgow, Glasgow (GB)

(*) Notice: Subject to any disclaimer, the term of this patent is extended or adjusted under 35 U.S.C. 154(b) by 0 days.

(21) Appl. No.: 10/466,971

(22) PCT Filed: Jan. 23, 2002

(86) PCT No.: PCT/GB02/00282

§ 371 (c)(1),
(2), (4) Date: Dec. 22, 2003

(87) PCT Pub. No.: WO02/060022

PCT Pub. Date: Aug. 1, 2002

(65) Prior Publication Data

US 2004/0075098 A1 Apr. 22, 2004

(30) Foreign Application Priority Data

Jan. 23, 2001 (GB) .............................. 0101642

(51) Int. Cl.[7] .............................. G02B 6/10; G02B 6/12
(52) U.S. Cl. .......................................... 385/129; 385/14
(58) Field of Search ...................... 385/14, 129; 372/46

(56) References Cited

U.S. PATENT DOCUMENTS

| 5,138,626 | A | * | 8/1992 | Yap .............................. 372/46 |
| 5,278,094 | A | * | 1/1994 | Lievin et al. .................. 438/40 |
| 5,307,357 | A | * | 4/1994 | Jost et al. ....................... 372/7 |
| 5,418,190 | A | * | 5/1995 | Cholewa et al. .............. 438/33 |
| 5,436,195 | A |   | 7/1995 | Kimura et al. |
| 5,764,669 | A |   | 6/1998 | Nagai |
| 2003/0141511 | A1 | * | 7/2003 | Marsh et al. .................. 257/98 |

OTHER PUBLICATIONS

Jeff Hecht, "Understanding Fiber Optics," 2002, Prentice-Hall, 4th Ed. p. 212.*
European Patent Office, Communication Pursuant to Article 96(2) EPC (Examination Report) on Appln. No. 02 716 148.8, Jun. 4, 2004.
N. Shimada et al., "Selective Disordering of InGaAs Strained Quantum Well By Rapid Thermal Annealing With SiO2 Caps of Different Thicknesses For Photonic Integration", IEEE Conference Proceeding, Cat. No. 0–7803–6259–4/00, Sep. 25, 2000, pp. 117–118.
N. Eriksson et al., "Highly Directional Grating Outcouplers with Tailorable Radiation Characteristics", IEEE J. of Quantum Electronics, vol. 32, No. 6, pp. 1038–1047, (Jun. 1996).
A.C. Bryce et al., "CW and Mode–Locked Integrated Extended Cavity Lasers Fabricated Using Impurity Free Vacancy Disordering", IEEE J. of Selected Topics in Quantum Electronics, vol. 3, No. 3, pp. 885–891 (Jun. 1997).

* cited by examiner

Primary Examiner—Akm Enayet Ullah
Assistant Examiner—James D. Stein
(74) Attorney, Agent, or Firm—Daspin & Aument, LLP; Jefferson Perkins

(57) ABSTRACT

There is disclosed an improved optical device (110), such as a laser, modulator, amplifier, switch, ore the like. The invention provides an optically active device (110) comprising: an optically active region (150) having an input/output end (165); and an optically passive region (155, 160) extending from said input/output end (165, 170) of the optically active region (150) an input/output end (175, 180) of the device (110).

23 Claims, 5 Drawing Sheets

Intense Devices

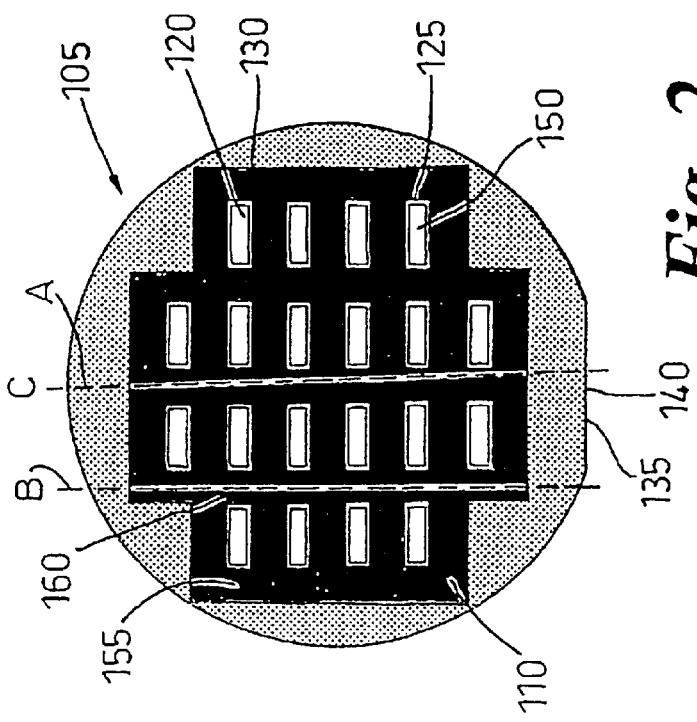
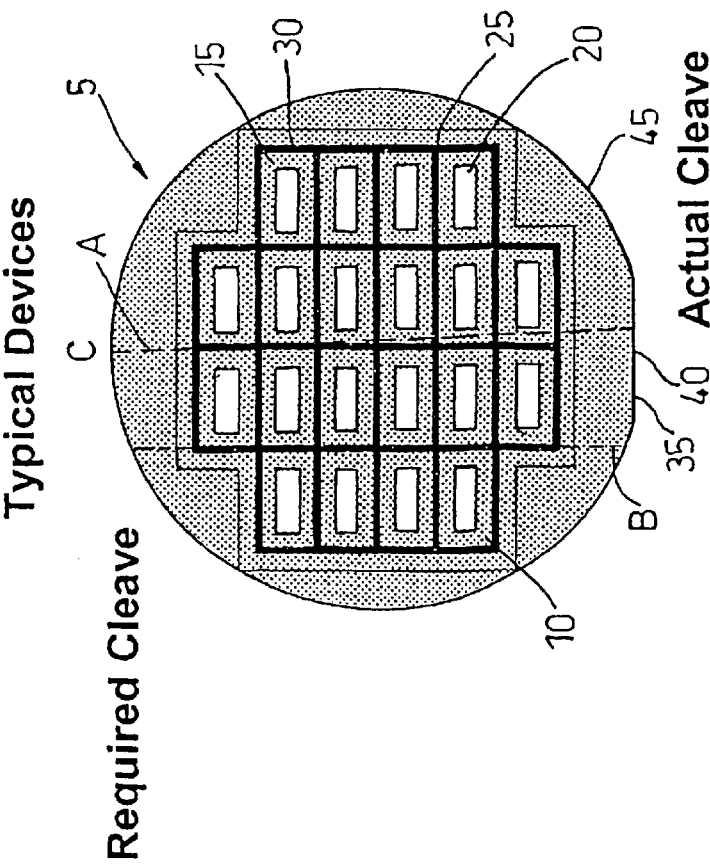

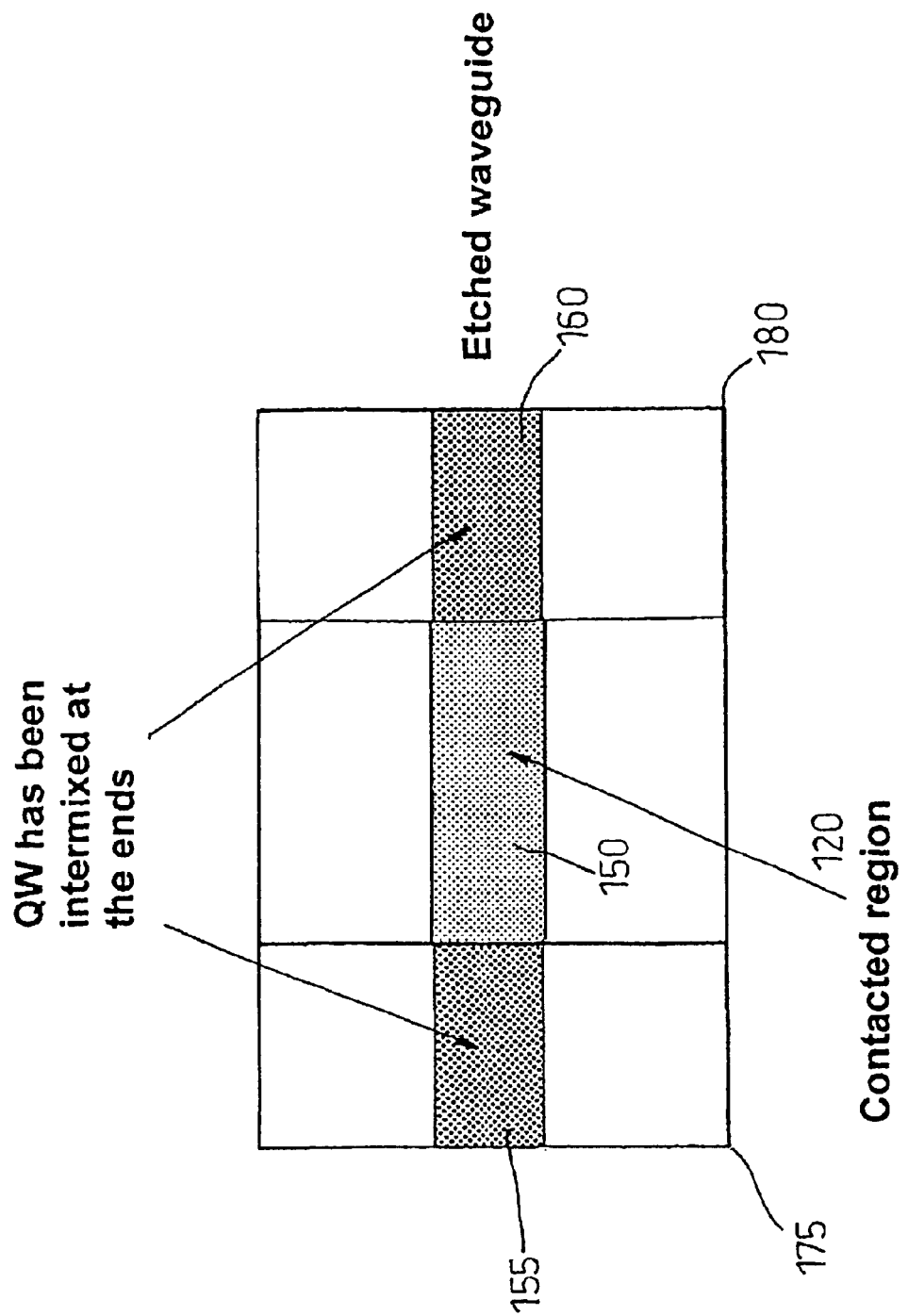

OPTICAL DEVICES

FIELD OF INVENTION

This invention relates to optical devices, and in particular, though not exclusively, to optically active or optoelectronic devices such as lasers, modulators, amplifiers, switches, and the like.

BACKGROUND OF INVENTION

Typically when edge emitting semiconductor laser devices or other edge input/output semiconductor optoelectronic devices are fabricated on a III–V semiconductor wafer, it is desirable to align input or output facets of the device perpendicular to or parallel with a wafer crystal cleavage plane. Often such alignment is not performed exactly, and typically there is an offset angle between a pattern of devices formed on the wafer and a cleavage plane adjacent the facets. This effect is termed "run-out", and has an impact on the device yield from a wafer.

"Run-out" can be understood to be a distance accumulated by the cleavage crystal plane away from the pattern of devices fabricated on the wafer. It impacts on the yield of devices from a given wafer since the cleave will not be in the same place for all devices along the cleave. This is a significant problem as the device facets so formed will not match-up as intended to where the contact pattern on the device is formed. However, to ensure the intended operation of each device, the active regions thereof (ie where one of the contacts is located) must operate in the designed fashion.

Further, in devices having contact layers such as relatively thick gold plated plates, (eg 2 to 3 microns), cleaving the devices out of the wafer causes problems as the contact layers may tend to delaminate. It is known to provide devices having metallic, eg gold layers, which are used as contact pads, heatsinking means, stress relief means and device handling protection means.

Yet further, when facet coatings are provided, eg on laser diodes, typically some of the coating may overlap onto other surfaces of the device. This results in insulation of this overlapped part of the device from electrical contact. Thus, if so-called "junction side down" bonding is attempted in such cases, good electrical and thermal communication is not possible with the device via the overlapped part.

It is an object of the present invention to obviate or at least mitigate the aforementioned problems in the prior art.

SUMMARY OF INVENTION

According to a first aspect of the present invention there is provided an optically active device comprising:
 an optically active region having an input/output end; and
 an optically passive region extending from said input/output end of the optically active region to an input/output end of the device.

Preferably the optically active region includes an electrical contact, an end of the electrical contact being spaced from the input/output end of the device.

Preferably the optically active device includes an optical waveguide, such as a ridge waveguide, formed over the optically active region and the optically passive region(s).

Preferably the electrical contact is provided on a portion of the waveguide, the portion comprising or being included within the optically active region.

The optically active device may be selected from a laser device, eg a laser diode, an optical modulator, an optical amplifier, an optical switch, or the like.

According to a first embodiment of the first aspect of the present invention there is provided an optically active device comprising:
 an optically active region having an output end; and
 an optically passive region extending from said output end of the optically active region to an output end of the device.

This first embodiment is particularly suited to semiconductor laser diodes.

According to a second embodiment of the first aspect of the present invention there is provided an optically active device comprising:
 an optically active region having an input end and an output end;
 a first optically passive region extending from said input end of the optically active region to an input end of the device; and
 a second optically passive region extending from said output end of the optically active region to an output end of the device.

In a most preferred form the optically active device is a semiconductor device preferably fabricated in a III–V materials system such as Gallium Arsenide (GaAs), eg working substantially in a wavelength range 600–1300 nm, or Indium Phosphide (InP), eg working substantially in a wavelength range 1200 to 1700 nm. For example, the material may be AlGaAs or InGaAsP.

Preferably the/one of the optically passive region(s) is at an output(s) of the optically active device.

Preferably, the semiconductor device may be of a monolithic construction. Preferably also the semiconductor device may be grown or otherwise formed on a substrate. More preferably, the semiconductor device comprises an active core layer sandwiched between a first (or lower) optical cladding/charge carrier confining layer and a second (or upper) optical cladding/charge carrier confining layer. The core layer and cladding layers may together form a slab waveguide.

It will be appreciated that "upper" and "lower" are used herein for ease of reference, and not to imply any particular preferred disposition of the layers. Indeed, in use, the device may be caused to adopt an inverted disposition.

The semiconductor device may include a ridge (or rib) formed in at least the second cladding layer which ridge may act, in use, as the optical waveguide so as to laterally confine an optical mode in the semiconductor device.

Preferably the active core layer may comprise a lasing material which may comprise or include a Quantum Well (QW) structure being configured as the optically active region, the optically active region being confined by the ridge.

The/each at least one optically passive region may be as laterally extensive as the optically active region.

Preferably the optically passive region(s) may include a first compositionally disordered material within the core layer.

In a modification, the optically active region may be laterally bounded by lateral regions including a second compositionally disordered material within the core layer.

Advantageously, the first and second compositionally disordered materials are substantially the same. Preferably the compositionally disordered materials may be formed by a Quantum Well Intermixing (QWI) technique. The QWI technique may wash out the quantum well confinement of the Quantum Wells within the active core layer.

More preferably, the QWI technique may be substantially impurity free. The QWI regions may be "blue-shifted", that is, typically at least 20 to 30 meV, and likely around 100 meV or more difference exists between the band-gaps of the optically active region pumped with current, and the QWI optically passive region(s). The optically passive regions may have a higher band-gap energy and therefore a lower absorption than the optically active region.

Thus when the optically active region is electrically driven the optically passive region(s) limit heat dissipation at end(s) of the device body.

Typically the passive regions may be around 10 to 100 microns in length.

Preferably the device also comprises respective layers of electrical contact material contacting at least a portion of an upper surface of the second cladding layer, and a (lower) surface of the first cladding layer, or more probably, a lower surface of the substrate. One of the contact materials may comprise the aforementioned electrical contact and may be provided on an upper surface of the ridge.

According to a second aspect of the present invention there is provided a wafer of material having formed thereon at least one and preferably a plurality of optically active devices, the/each optically active device comprising:

an optically active region having an input/output end; and an optically passive region extending from said input/output end of the optically active region to an input/output end of the device.

At least some of the optically active devices may be formed on said wafer in a substantially lateral relation one to the other.

Also, at least some of the optically active devices may be formed on said wafer in a substantially longitudinal relation one to the other.

According to a third aspect of the present invention, there is provided an optically active device when cleaved from a wafer of material according to the second aspect of the present invention.

According to a fourth aspect of the present invention, there is provided a method of manufacturing at least one optically active device comprising the steps of:

(a) providing a wafer of material;

(b) forming on the wafer of material the/each optically active device, the/each device comprising:

an optically active region having an input/output end; and an optically passive region extending from said input/output end of the optically active region to an input/output end of the device;

(c) cleaving the/each optically active device from said wafer including the step of cleaving the wafer at a wafer material cleavage plane(s) adjacent to or substantially coincident with the input end and/or output end of the optically active device.

Step (a) may include the step of:

forming in order:

a first optical cladding/charge carrier confining layer;

an optically active or core layer (which may comprise an optically and electrically active layer, in which is optionally formed a quantum well (QW) structure); and a second optical cladding/charge carrier confining layer.

Step (b) may include for each device:

forming the optically passive region(s) in the optical active layer;

forming a ridge from at least a portion of the second cladding layer to confine the optically active gain region, and at least one of the optically passive region(s)

The first cladding layer, optically active layer and second cladding layer may be grown by known techniques such as Molecular Beam Epitaxy (MBE) or Metal Organic Chemical Vapour Deposition (MOCVD).

Preferably the passive region(s) may be formed by a Quantum Well Intermixing (QWI) technique which preferably comprises generating vacancies in the passive regions, or may alternatively comprise implanting or diffusing ions into the passive region(s), and further comprises annealing to create a compositionally disordered region(s) of the optically active layer (which may comprise a lasing material), having a larger band-gap than Quantum Well structure. The passive region(s) may therefore be formed by Quantum Well Intermixing (QWI).

Preferably the ridge may be formed by known etching techniques, eg dry or wet etching.

Preferably the first cladding layer may be formed on a substrate.

Preferably, the optically passive regions may be formed by generating impurity free vacancies and more preferably may use a damage induced technique to achieve Quantum Well Intermixing. In a preferred implementation of such a technique, the method may include the steps of:

depositing by use of a diode sputterer and within a substantially Argon atmosphere a dielectric layer such as Silica ($SiO_2$) on at least part of a surface of the semiconductor laser device material so as to introduce point structural defects at least into a portion of the material adjacent the dielectric layer;

optionally depositing by a non-sputtering technique such as Plasma Enhanced Chemical Vapour Deposition (PECVD) a further dielectric layer on at least another part of the surface of the material;

annealing the material thereby transferring Gallium from the material into the dielectric layer.

Such a technique is described in co-pending application entitled "Method of Manufacturing Optical Devices and Related Improvements" also by the present Applicant, and having the same filing date as the present application, the content of which is incorporated herein by reference.

Preferably, the method may include the step of applying first and second contact layers on a surface of the first cladding layer or more preferably, an outer surface of the substrate, and an outer surface of the ridge. More preferably, the second contact layer may be provided on a portion of the ridge within an area of the optically active region.

BRIEF DESCRIPTION OF DRAWINGS

An embodiment of the present invention will now be described by way of example only, with reference to the accompanying drawings, in which:

FIG. 1 shows a wafer of material having formed thereon a plurality of optically active devices according to the prior art;

FIG. 2 shows a wafer of material having formed thereon a plurality of optically active devices according to an embodiment of the present invention;

FIG. 6 shows a schematic plan view of the optically active device of FIG. 3.

DETAILED DESCRIPTION OF DRAWINGS

Figure 3:
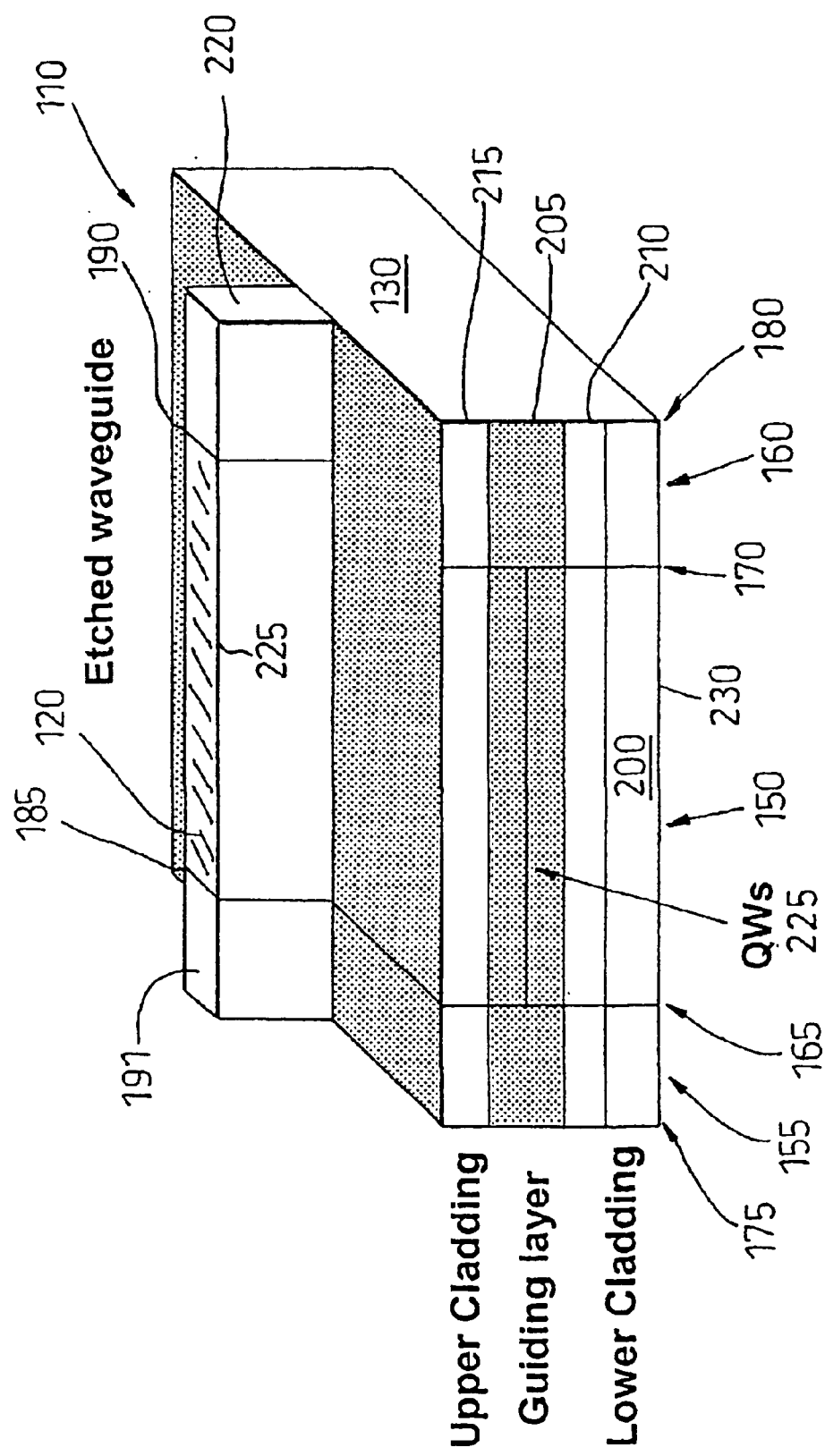
FIG. 3 shows a schematic perspective view from one side, one end and above an optically active device according to an embodiment of the present invention.
Figure 4:
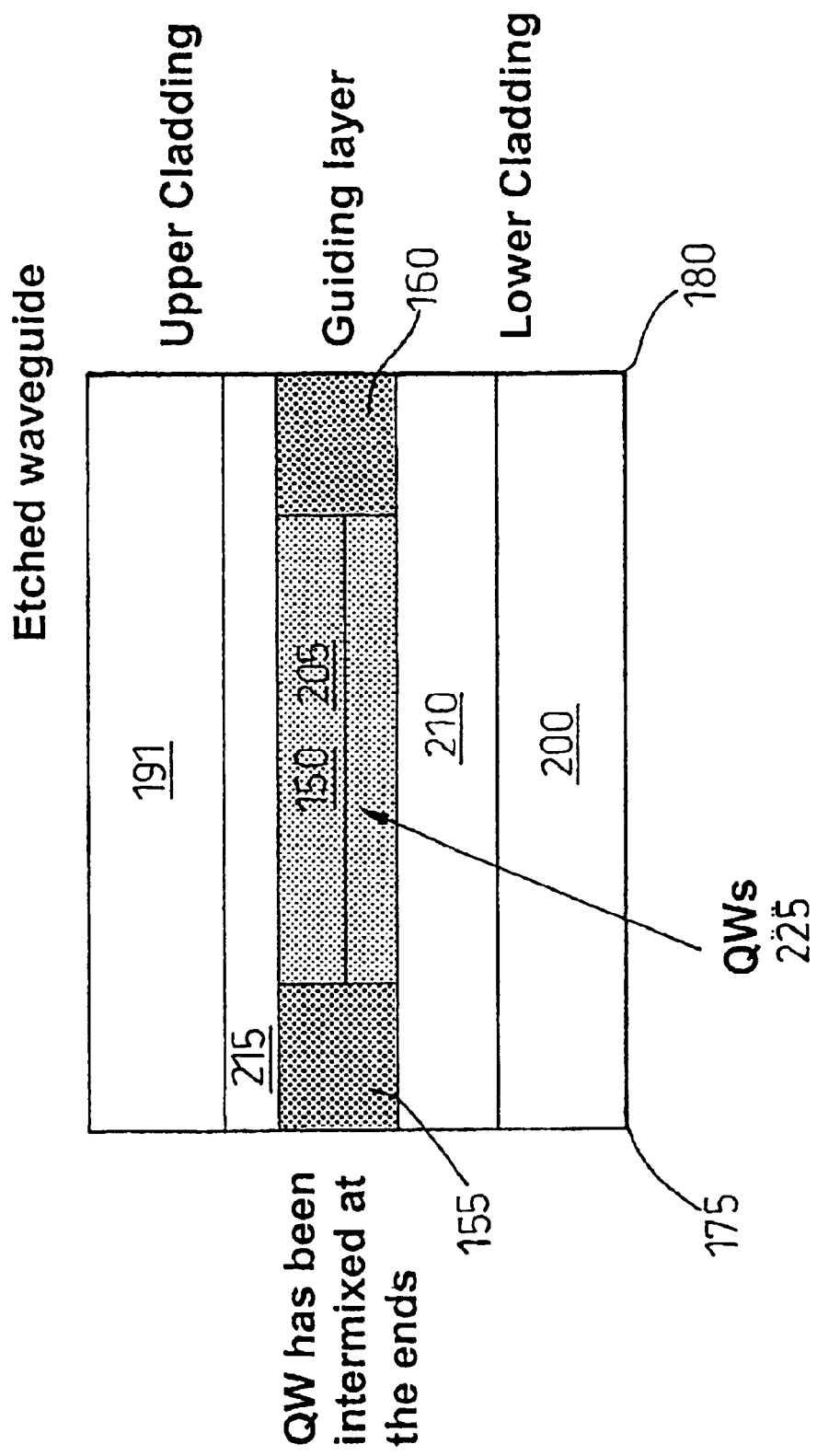
FIG. 4 shows a schematic view from one side of the optically active device of FIG. 3.
Figure 5:
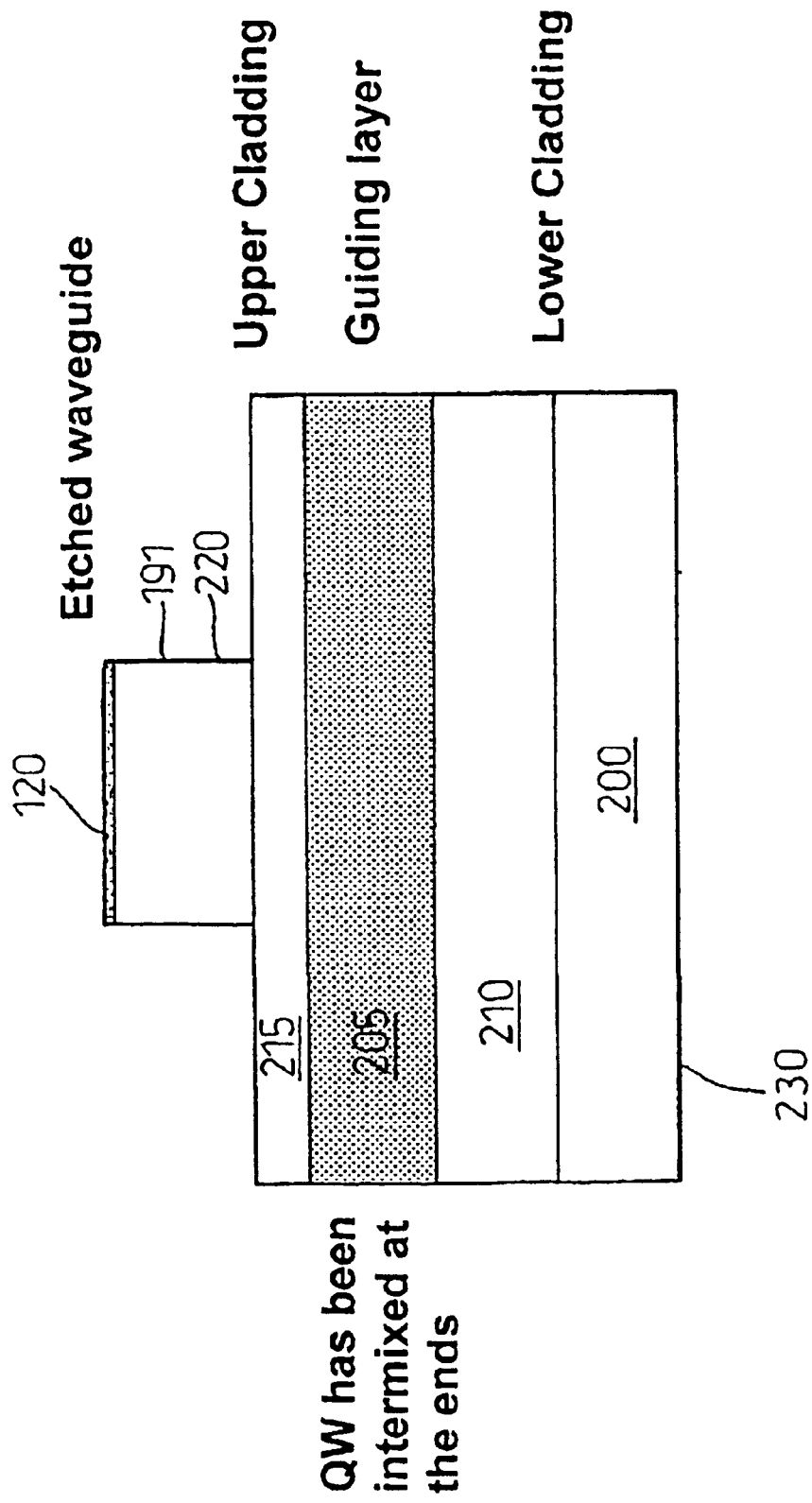
FIG. 5 shows a schematic view from one end of the optically active device of FIG. 3.

Referring initially to FIG. 1, there is shown a wafer, generally designated 5, according to the prior art, including a plurality of optically active devices 10. Each device 10 is formed in/on the wafer 5, and each device 10 has on an outer surface thereof a first contact 15 and within an area of the first contact 15, a second contact 20 which is thicker than the first contact 15. The plurality of devices 10 are distinguished from one another by lines of insulation material 25. The pattern or array of devices 10 is intended to be aligned such that an input or output facet 30 of each device 10 is substantially parallel to a cleavage plane of the wafer 5. The cleavage plane is defined according to the crystallographic orientation of the wafer by reference to a so-called "flat" 40 provided at an outer edge 45 of the wafer 5.

As can be seen from FIG. 1, rather than the facets 30 being aligned parallel to a line "A" parallel or coincident with a cleavage plane 40, in the process fabrication of the devices 10 a misalignment may occur and the input/output facets 30 of the devices 10 may in fact be aligned to a line "B" which runs at a shallow angle to the line "A". Thus, if during cleavage of the devices 10 out of the wafer 5, the wafer 5 is nicked or scribed at a location "C", then the cleavage plane "A" will cut across a plurality of the devices 10 misaligned from the adjacent input/output facet 30. Accordingly, some of the devices 10 will have a shortened length, while some of the devices 10 will have a longer length than intended. This effect is known as "run-out" and affects the yield of devices 10 from the wafer 5, as hereinbefore described.

Referring now to FIG. 2, there is shown a wafer of material, generally designated 105 according to an embodiment of the present invention, the wafer 105 having formed thereon a plurality of optically active devices 110. As can be seen from FIG. 2, each device 110 has an electrical contact pad such as a gold (Au) plated contact 120, formed thereon. Further, around the electrical pad 120, each device 110 has an insulation layer 125. An input/output facet 130 of each device 110 is provided at each end of each device 110. However, an active region of each device 110 is shorter than the distance between the input and output facets 130 of the device 110, as will hereinafter be described in greater detail. Accordingly, each device 110 comprises an active region 150 formed substantially coincident with an electrical contact 120, and passive regions 155, 160 provided at respective longitudinal ends of the contact 120 of the active region 150. As can be seen from FIG. 2, any misalignment of the pattern of devices 110 with respect to line A parallel to or forming a cleavage plane 140 has no affect on the yield of devices from the wafer 105, since any "run-off" occurs within an area comprising the passive regions 155, 160 and insulator layer 125. Thus the active regions 150 and contact pads 120 of the devices 110 are unaffected by the "run-out" effect.

Referring now to FIGS. 3 to 6, each device 110 according to this embodiment, is shown in more detail.

Each optically active device 110 comprises optically active region 150 having an input end 165 and an output end 170; and optically passive regions 155, 160 extending from said input end 165 and output end 170 of the optically active region 150, respectively, to an input end 175 and output end 180 of the device 110.

The optically active region 150 includes electrical contact 120, ends 185, 190 of the electrical contact 120 being spaced from the input end 175 and output end 180 of the device 110 respectively. As can be seen from FIG. 3, the optically active device 110 includes an optical waveguide in the form of a ridge waveguide 190 formed over the optically active region 150, and the optically passive regions 155, 160. The electrical contact 120 is provided on a portion of the waveguide 190, the portion corresponding to the optically active region 150.

During conventional device fabrication processes, devices 10 are generally aligned to the crystallographic orientation of the wafer, by reference to the major flat 40, within a tolerance of plus or minus 0.5 degrees. Therefore, a maximum run-out distance over the useable diameter of a 50 mm wafer is approximately 350 to 450 microns in either direction. With larger wafers, e.g. 100 mm or 200 mm diameters, corresponding maximum run-out values would be 900 and 1800 microns in either direction respectively.

It is also desirable to take into account normal variations in the accuracy of the cleave operation, which can typically be of the order of 0.05 degrees.

Thus, according to a preferred embodiment of the invention, the optically passive regions 155, 160 of devices 110 before cleavage from the wafer each extend over a length of at least 400 microns when fabricated on a 50 mm wafer, in order that the cleavage plane always falls within the optically passive regions of the devices over the normal useable diameter of the wafer (=40 mm for a 50 mm diameter wafer). In other words, on the wafer, the optically active regions of adjacent devices are separated by an extended optically passive region (comprising the optically passive regions for both devices) of at least 700 microns (2×350 microns) and more preferably at least 800 or 900 microns on a 50 mm wafer.

On larger wafers, e.g. 200 mm the minimum length of optically passive regions 155, 160 would preferably be 800 microns per device. Preferably, the optically passive regions per device extend over a length of between 850 and 900 microns.

The devices are arranged on the wafer in the array shown. The optically passive regions as fabricated extend between corresponding devices in adjacent columns. The devices in adjacent columns are thereby separated from one another by a sufficient length of optically passive region that any angular misalignment of the array of up to plus or minus 0.5 degrees with reference to the cleavage plane of the wafer will still result in the entire cleavage plane passing through the optically passive regions 155, 160 of adjacent devices and not through the active regions 150.

In a preferred form, the optically active device 110 is a semiconductor device fabricated in a III–V semiconductor material system such as Gallium Arsenide (GaAs), working substantially in a wavelength range 600 to 1300 nm. Alternatively the semiconductor device may be fabricated in Indium Phosphide (InP), eg working in a wavelength range 1200 to 1700 nm.

As can be seen from FIGS. 3 to 6, the device 110 is of a monolithic construction grown on a substrate 200. The device 110 comprises an active core layer 205, sandwiched between a first optical cladding/charge carrier confining layer 210, and a second optical cladding/charge carrier confining layer 215. The first cladding layer 210 the core layer 205, and the second cladding layer 215, may typically each have refractive indices of around 3.3 to 4.0, the core layer 215 having a refractive index which is higher than that of the cladding layers 205, 210. The core layer 205 and first and second cladding layers 210 to 215, therefore, together form a slab waveguide.

As seen from FIG. 3, the device 110 includes a ridge 220 (or rib), formed in at least the second cladding layer 215 which ridge 220 may act, in use, as the optical waveguide 190 so as to laterally confine an optical mode in the device 110. The core layer 205 may comprise and/or include a quantum well (QW) structure 225 being configured as the optically active region 150, the optically active region 150 being confined by the ridge 220. The/each one optically passive region 155, 160 is as laterally extensive as the optically active region 150.

The optically passive regions 155, 160 may include a first compositionally disordered material within the core layer 205. Further, in a modification the optically active region 150 may be laterally bounded by lateral regions including a second compositionally disordered material within the active layer 205. The first and second compositionally disordered materials may be substantially the same, and may be formed by a Quantum Well Intermixing (QWI) technique. The QWI technique washes out the quantum well confinement of the quantum wells 225 within the active core layer 205.

The technique requires, using a diode sputterer and within a substantially Argon atmosphere:

depositing a dielectric layer such as Silica ($SiO_2$) on at least part of a surface of the semiconductor laser device material so as to introduce point structural defects at least into a portion of the material adjacent the dielectric layer;

optionally depositing by a non-sputtering technique such as Plasma Enhanced Chemical Vapour Deposition (PECVD) a further dielectric layer on at least another part of the surface of the material;

annealing the material thereby transferring Gallium from the material into the dielectric layer;

The QWI technique may be substantially impurity free. The QWI regions 155, 160 may be "blue-shifted", that is typically at least 20 to 30 meV likely around 100 meV, or more difference exists between the band-gaps of the active layer 205 in the optically active region 150 pumped with current, and the QWI region in the active layer 205 in the optically passive regions 155, 160. The optically passive regions 155, 160 therefore have a higher band-gap energy and therefore have a lower absorption than the optically active region 150. Therefore the passive regions 155, 160 are transparent to light generated or transmitted through a portion of the core layer 205 corresponding to the optically active region 150.

Typically, the passive regions 155, 160 may be around 10 to 100 microns in length. The device 110 also includes respective layers of electrical contact material 225,230, contacting a least a portion of a surface of the ridge 220 and an opposing surface of the substrate 200. One of the contact materials 225 therefore comprises of the aforementioned electrical content 120.

A method of manufacturing at least one optically active device 110 will now be described.

The method comprises the steps of:
(a) providing a wafer 105 of material;
(b) forming on the wafer 105 the/each optically active device 110;
(c) cleaving the/each optically active device 110 from said wafer 105, including the step of cleaving the wafer 105 at wafer material cleavage planes adjacent to or substantially coincident with the input end 175 and with the output end 180 of the optically active device 110.

Step (a) includes the steps of: providing the substrate 200, growing thereon the first optical cladding layer 210, optically active or core layer 205, (optionally formed with the quantum well structure 225), and second optical cladding layer 215. The first cladding layer 210, optically active layer 205, and second cladding layer 215 may be grown by known techniques such as Molecular Beam Epitaxy (MBE) or a Metal Oxide Chemical Vapour Deposition (MOCVD).

Step (b) may include for each device 110:
(i) forming the optically passive regions 155, 160 in the optically active layer 205;
(ii) forming ridge 220 from at least a portion of the second cladding layer 215 so as to optically confine the optically active region 150 and at least one of the optically passive regions 155, 160.

The passive regions 155, 160 are preferably formed by a Quantum Well Intermixing (QWI) technique which comprises generating vacancies in the passive regions 155, 160. Alternatively, the QWI technique may comprise implanting or defusing ions into the passive regions 155, 160. The QWI technique may also include the subsequent step of annealing to create the compositionally disordered regions 155, 160 of the optically active layer 205, having a larger band-gap than the quantum well structure 225 per se. Passive regions 155, 160 may therefore be formed by QWI. Further, the ridge 220 may be formed by known etching techniques, eg dry or wet etching.

The optically passive regions 155, 160 may be formed by generating impurity free vacancies, and more preferably, may use a damage induced technique to achieve QWI.

The method of manufacture of each device 110 also includes the step of applying the first and second contact layers 225,230 on the surface of each ridge 220, and the opposing surface 230 of the substrate 200.

It will be understood by those skilled in the art that the embodiment of the present invention hereinbefore described is given by way of example only, and is not meant to limit the scope thereof in any way.

Particularly, it will be appreciated that the provision of extended passive input/output waveguide sections to optically active devices according to the present invention reduces the effect of "run-out" since an area of tolerance is built into a wafer to facilitate ease of cleaving, and therefore significantly improves device yield from a wafer.

What is claimed is:

1. A wafer of material having formed thereon a plurality of optically active devices arranged in a row in a longitudinal direction with respect to one another, the wafer having a normal useable diameter, the optically active devices each comprising:

an optically active region having an input end and an opposed output end which is longitudinally spaced from the input end;

a first optically passive region longitudinally extending from the input end of the optically active region to an input end of the device; and a second optically passive region longitudinally extending from the output end of the optically active region to an output end of the device;

the first and second optically passive regions of each successive pair of longitudinally aligned and adjacent devices forming a single extended optically passive region through which the devices may be cleaved from one another along a preselected cleavage plane, an overall length of the extended optically passive region being sufficient that errors in orthogonal alignment of the cleavage plane relative to the longitudinal axis of the devices of up to plus or minus 0.5 degrees always result in the cleave falling within the extended optically passive region over the normal useable diameter of the wafer.

2. The wafer of claim 1, wherein the normal useable diameter of the wafer is approximately 50 mm, the overall length of the extended optically passive region being at least 700 microns.

3. The wafer of claim 1, wherein the normal useable diameter of the wafer is approximately 50 mm, the overall length of the extended optically passive region being at least 800 microns.

4. The wafer of claim 1, wherein the normal useable diameter of the wafer is approximately 100 mm, the overall length of the extended optically passive region being at least 1500 microns.

5. The wafer of claim 1, wherein the normal useable diameter of the wafer is approximately 100 mm, the overall length of the extended optically passive region being at least 1800 microns.

6. The wafer of claim 1, wherein the normal useable diameter of the wafer is approximately 200 mm, the overall length of the extended optically passive region being at least 1600 microns.

7. The wafer as claimed in claim 1, wherein the optically active region of at least one device includes an electrical contact, an end of the electrical contact being longitudinally spaced from the output end of the device by at least the second optically passive region.

8. A wafer as claimed in claim 1, wherein the optically active region of at least one device includes an electrical contact, an end of the electrical contact being longitudinally spaced from the input end of the device by at least the first optically passive region.

9. A wafer as claimed in claim 1, wherein each optically active device includes an optical waveguide formed over the respective optically active region and the respective first and second optically passive regions.

10. A wafer as claimed in claim 9, wherein an electrical contact is provided on a portion of the waveguide, the portion being included within the optically active region.

11. A wafer as claimed in claim 1, wherein the optically active devices are each selected from one of a laser device, an optical modulator, an optical amplifier, and an optical switch.

12. A wafer as claimed in claim 1, wherein the optically active device is a semiconductor laser diode.

13. A wafer as claimed in claim 1, wherein the optically active devices are semiconductor devices fabricated in a III–V semiconductor materials system.

14. A wafer as claimed in claim 13, wherein the 111–V semiconductor materials system is a Gallium Arsenide (GaAs) based system operating substantially in a wavelength range from 600 to 1300 nm or an Indium Phosphide (InP) based system operating substantially in a wavelength range from 1200 to 1700 nm.

15. A wafer as claimed in claim 13, wherein the semiconductor devices are grown on a substrate.

16. A wafer as claimed in claim 13, wherein each optically active device includes an active core layer sandwiched between a first optical cladding confining layer and a second optical cladding layer, the core layer and cladding layers together forming a slab waveguide.

17. A wafer as claimed in claim 16, wherein each optically active device includes a ridge formed in at least the second cladding layer which ridge acts, in use, as an optical waveguide so as to laterally confine an optical mode in the optically active device.

18. A wafer as claimed in claim 17, wherein the active core layer comprises a lasing material which comprises a Quantum Well (QW) structure being configured as the optically active region, the optically active region being confined by the ridge.

19. A wafer as claimed in claim 1, wherein each optically passive region is as laterally extensive as an adjacent optically region.

20. A wafer as claimed in claim 16, wherein the optically passive regions include a first compositionally disordered material within the core layer.

21. A wafer as claimed in claim 20, wherein each optically active region is laterally bounded by lateral regions including a second compositionally disordered material within the core layer.

22. A wafer as claimed in claim 21, wherein the first and second compositionally disordered materials are substantially the same.

23. A wafer as claimed in claim 20, wherein the first compositionally disordered material is formed by a Quantum Well Intermixing (QWI) technique.

* * * * *